United States Patent
Aliane et al.

(10) Patent No.: US 12,015,097 B2
(45) Date of Patent: Jun. 18, 2024

(54) GERMANIUM-BASED PLANAR PHOTODIODE WITH A COMPRESSED LATERAL PERIPHERAL ZONE

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Hacile Kaya, Grenoble (FR); Zouhir Mehrez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/483,594

(22) Filed: Oct. 10, 2023

(65) Prior Publication Data
US 2024/0128393 A1  Apr. 18, 2024

(30) Foreign Application Priority Data
Oct. 14, 2022  (FR) ..................... 2210639

(51) Int. Cl.
H01L 31/105 (2006.01)
H01L 31/18 (2006.01)
(52) U.S. Cl.
CPC ...... *H01L 31/1055* (2013.01); *H01L 31/1812* (2013.01)
(58) Field of Classification Search
CPC .............. H01L 31/1055; H01L 31/1812
See application file for complete search history.

(56) References Cited

U.S. PATENT DOCUMENTS

| 4,894,703 A * | 1/1990 | Hamamsy | H01L 31/02161 |
| | | | 257/E31.061 |
| 11,264,425 B2 * | 3/2022 | Ouvrier-Buffet | H01L 31/1804 |
| 2020/0168758 A1 | 5/2020 | Aliane et al. | |
| 2021/0104644 A1 | 4/2021 | Aliane et al. | |
| 2021/0111205 A1 | 4/2021 | Aliane et al. | |

FOREIGN PATENT DOCUMENTS

| EP | 3 657 556 A1 | 5/2020 |
| EP | 3 806 167 A1 | 4/2021 |
| WO | WO 2019/202250 A1 | 10/2019 |

OTHER PUBLICATIONS

Preliminary French Search Report dated Apr. 28, 2023 in French Application 22 10639 filed on Oct. 14, 2022, 12 pages (with English Translation of Categories of Cited Documents & Written Opinion).

* cited by examiner

*Primary Examiner* — Seung C Sohn
(74) *Attorney, Agent, or Firm* — Oblon, McClelland, Maier & Neustadt, L.L.P.

(57) ABSTRACT

The invention relates to a planar photodiode 1 including a detection portion 10 made of a germanium-based material M0, and a peripheral lateral portion 3 including several materials stacked on top of one another, including a material M1 having a coefficient of thermal expansion lower than that of the material M0, and a material M2 having a coefficient of thermal expansion higher than or equal to that of the material M0. The intermediate region 13 includes a portion P1 surrounded by the material M1 and having tensile stresses. It also includes a portion P2 surrounded by the material M2 and having compressive stresses. This portion P2 surrounds a n doped box 12.

10 Claims, 5 Drawing Sheets

GERMANIUM-BASED PLANAR PHOTODIODE WITH A COMPRESSED LATERAL PERIPHERAL ZONE

TECHNICAL FIELD

The field of the invention is that of germanium-based planar photodiodes. The invention finds application in particular in the field of detection of a light radiation in the near-infrared range.

PRIOR ART

The photodetection optoelectronic devices may include an array of planar photodiodes. The photodiodes then extend over the same main plane, between first and second opposite faces parallel to each other. Each of them then includes a detection portion derived from the same semiconductor layer, for example of a first region (seed layer) made of p+ doped germanium and flush with the first face, of a second region (box) made of n+ doped germanium and flush with the second face, and of an intermediate region made of intrinsic or very slightly p doped germanium, and located between the first and second doped regions. This intermediate region surrounds the second n+ doped region in the main plane of the photodiode, and is flush with the second face. A passivation layer made of a dielectric material usually covers the second face, and allows limiting the contribution of the dark current to the electrical current measured by each photodiode.

This detection portion may be surrounded by a peripheral lateral portion, made of an electrically-conductive material, which surrounds the detection portion in the main plane of the photodiode and comes into contact with the first p+ doped region. This peripheral lateral portion then ensures an optical insulation function with the neighboring planar photodiodes and allows applying an electrical potential at the first p+ doped region starting from the second face. It may also allow generating mechanical tensile stresses in the detection portion.

Indeed, when the material of the absorption portion is germanium-based, it could be tensioned so as to make its energy gap structure direct and no longer indirect. In addition, the photodiode may then be adapted to absorb a light radiation up to a cutoff wavelength longer than 1550 nm, which is the absorption cutoff wavelength of the relieved germanium, for an application in particular in the near-infrared range (SWIR, standing for Short Wavelength IR).

In this respect, the document WO 2019/202250 A1 describes an example of such a planar photodiode, where the peripheral lateral portion is made of a piezoelectric material. The deformation of the peripheral lateral portion in the main plane, by inverse piezoelectric effect, allows tensioning the detection portion.

The document EP 3 806 167 A1 describes another example of a planar photodiode. In this case, the peripheral lateral portion is made of a p+ doped silicon based material. Tensioning of the detection portion is obtained when making the peripheral lateral portion by epitaxy, by the thermal expansion differential between germanium and silicon.

Moreover, it arises that the presence of the passivation dielectric layer could nevertheless contribute to generating a non-negligible dark current. Thus, the article of Sood et al. entitled *Characterization of SiGe-Detector Arrays for Visible-NIR Imaging Sensor Applications*, Proc. of SPIE VOL. 8012, 801240, 2011, describes a method for manufacturing a passivated photodiode allowing limiting the dark current.

The dark current is related to the presence of a depleted area located in the semiconductor material of the photodiode, at the interface with the passivation dielectric layer. The manufacturing method then includes a step of annealing the photodiode under $N_2H_2$, allowing transforming this depleted area into a hole accumulation area. This step then allows reducing the intensity of the dark current.

Yet, it arises that this annealing step, intended to modify the depleted area into an accumulation area, could induce a degradation of the performances of the photodiode, in particular because of a undesirable modification of the dimensions of the n+ doped box, in particular when the lateral diffusion of the n-type dopant elements is considerable. Moreover, the presence and the characteristics of the depleted area may be determined by the technique used to deposit the passivation dielectric layer as well as the operating conditions. This results in that the considered annealing could then not allow obtaining the desired accumulation area, and therefore the desired reduction of the dark current, in a repeatable manner.

Also, the document EP 3 657 556 A1 describes an example of a passivated photodiode made based on germanium including a p doped peripheral region surrounding the n+ doped box and flush with the germanium face covered with the passivation dielectric layer. This p doped peripheral region is located between the n+ doped box and the peripheral lateral portion, and allows reducing the dark current by limiting the surface component of the dark current.

The document EP 3 660 930 A1 is also known which describes another example of a passivated photodiode made based on germanium. The passivation layer is not made of a dielectric material but is made based on silicon. An annealing is performed to cause an interdiffusion of silicon of the passivation layer and of germanium of the detection layer. Thus, the n+ doped box is surrounded by a SiGe-based peripheral area which forms a "gap opening" allowing limiting the surface component of the dark current.

Finally, the document EP 3 971 995 A1 is known which describes another example of a passivated photodiode made based on germanium. It includes a peripheral portion made of a ferroelectric material, located between and in contact with the intermediate region and of the passivation dielectric layer, and which surrounds the n+ doped box in the main plane. By the desired orientation of the ferroelectric dipoles upon polarization of the photodiode, this ferroelectric peripheral portion allows limiting or avoiding the formation of a depleted area or of an inversion area in the detection portion, and allows avoiding the flow of charge carrier in this same ferroelectric peripheral portion, between the n+ doped box and the peripheral lateral region.

However, there is a need to provide another solution allowing reducing the dark current in a planar photodiode and in particular its surface component located between the n+ doped box and the peripheral lateral portion.

DISCLOSURE OF THE INVENTION

An objective of the invention is to overcome at least part of the drawbacks of the prior art, and more particularly to provide a planar photodiode allowing obtaining a low dark current, and in particular of its surface component.

For this purpose, an object of the invention is a planar photodiode including:
- a so-called detection portion of a main semiconductor layer, made of at least one germanium-based crystalline semiconductor material M0, having first and second faces parallel to a main plane, and including: a p-type doped first region, flush with the first face; a n-type doped second region, flush with the second face; and an intermediate region, extending between the first and second doped regions, and surrounding the second doped region in the main plane while being flush with the second face;

a peripheral lateral portion, intended to be electrically polarized, made of at least one first electrically-conductive material M1, extending, along a vertical axis orthogonal to the main plane, until coming into contact with the first doped region, and extending in contact with the detection portion while surrounding the intermediate region in the main plane; the first material M1 having a coefficient of thermal expansion CTE1 lower than that of the material M0, extending from the first face, the intermediate region including a first portion P1, surrounded by the first material M1 in the main plane, having mechanical tensile stresses.

According to the invention, the peripheral lateral portion includes several distinct electrically-conductive materials, stacked on top of one another along the vertical axis, including: at least one second material M2, extending between the first material M1 and the second face, having a coefficient of thermal expansion CTE2 higher than or equal to that of the material M0.

The intermediate region then includes a second portion P2 flush with the second face F2, surrounded by the second material M2 in the main plane, formed by a peripheral lateral area Z2p having mechanical compressive stresses. This peripheral lateral area Z2p surrounds in the main plane a central area Z2c having mechanical tensile stresses and where the second doped region is located.

Some preferred, yet non-limiting, aspects of this photodiode are as follows.

The first material M1 may extend, along the thickness axis of the photodiode, starting from the first face F1 over a distance comprised between 50% and 80% of the thickness of the detection portion, and the second material M2 extends, along the thickness axis of the photodiode, starting from the first material M1 up to the second face F2 over a distance comprised between 20% and 50% of the thickness of the detection portion.

The material M1 may be based on p-type doped silicon, and the material M2 may be selected from among a metallic material and a p-type doped germanium-based semiconductor material.

The planar photodiode may include an interlayer thin portion, made of at least one metallic material, and located between the p-type doped silicon-based material M1 and the metallic material M2.

The first material M1 may be made based on p-type doped silicon and the second material M2 may be made of a metallic material, the detection portion including a p-type doped lateral region extending over the entire height of the peripheral lateral portion and in contact with the latter.

The first material M1 may be made based on p-type doped silicon, the detection portion including a lateral area made based on germanium silicon, extending over the entire height of the peripheral lateral portion and in contact with the latter.

The planar photodiode may include an upper insulating layer, made of a dielectric material, extending over the second face in contact with the intermediate region and at the peripheral lateral area Z2p.

The invention also relates to a method for manufacturing at least one planar photodiode according to any one of the preceding features, including the following steps:

making the main semiconductor layer;

making at least one trench to form the detection portion;

depositing the first material M1 at a deposition temperature T1 higher than room temperature, so as to fill the trench, then returning to room temperature;

making at least one indentation by partial etching of the first material M1;

depositing the second material M2 at a deposition temperature T2 higher than room temperature, so as to fill the indentation, then returning to room temperature, thereby obtaining the central area Z2c and the peripheral lateral area Z2p.

The method may include a step of making the second doped region located in the central area Z2c.

The main semiconductor layer may be made starting from a support layer having a coefficient of thermal expansion lower than the coefficient CTE0 of the material M0.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings, wherein.

DETAILED DISCLOSURE OF PARTICULAR EMBODIMENTS

Figure 1A:
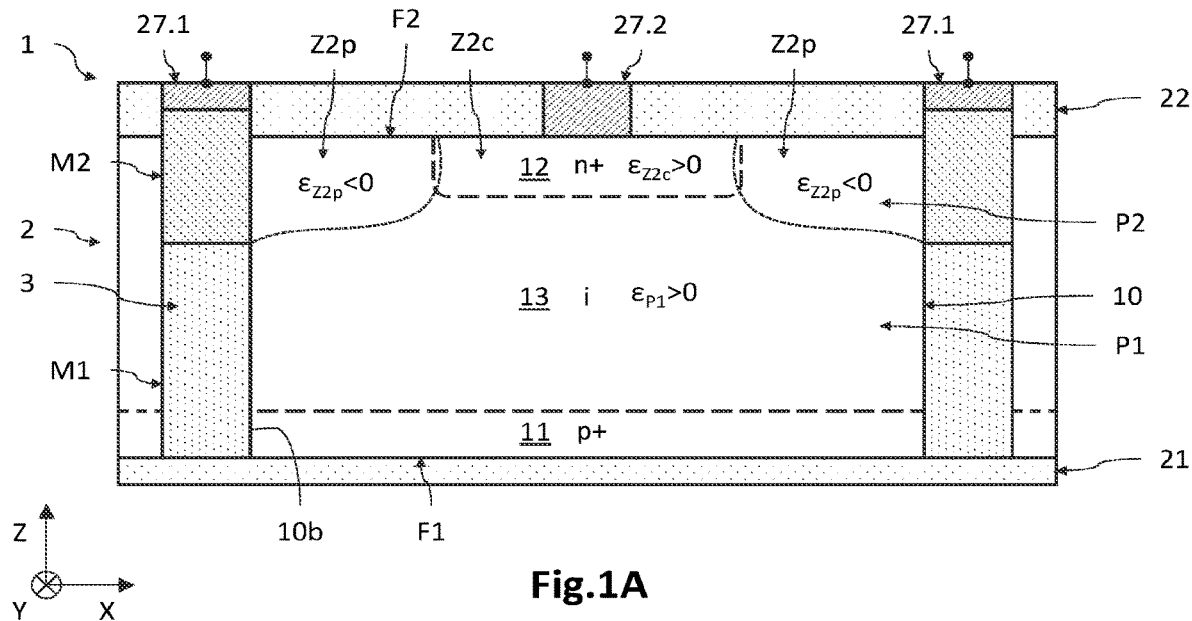
FIG. 1A is a schematic cross-sectional view of a planar photodiode according to one embodiment.

In the figures and in the following description, the same references represent identical or similar elements. In addition, the different elements are not plotted to scale so as to favor clarity of the figures. Moreover, the different embodiments and variants are not exclusive of one another and could be combined together. Unless stated otherwise, the terms "substantially", "about", "in the range of" mean within a 10% margin, and preferably within a 5% margin. Moreover, the terms "comprised between . . . and . . . " and the same mean that the bounds are included, unless stated otherwise.

The invention generally relates to a planar photodiode, and preferably to an array of photodiodes, as well as a method for manufacturing such a photodiode. Each photodiode includes a detection portion made based on germanium, and is adapted to detect a light radiation in the near-infrared (SWIR) range corresponding to the spectral range from about 0.8 μm to 1.7 μm, and possibly up to about 2.5 μm. In other words, it is adapted to detect a light radiation at a cutoff wavelength longer than 1550 nm.

The photodiode(s) is/are made starting from the same main semiconductor layer. The latter extends in a main plane, and has a first face and a second face opposite to each other and parallel to the main plane. Hence, the two faces extend along identical planes for each of the photodiodes, and vertically (along the thickness axis) delimit the detection portion.

The photodiodes do not have a mesa structure to the extent that they are made starting from the same main semiconductor main layer and are optically insulated from each other by a peripheral lateral portion. Thus, they have a particularly high fill factor. Moreover, they are herein preferably passivated to the extent that the face where the n+ doped box is flush is at least partially covered with a passivation dielectric layer. The latter contributes to reducing the surface component of the dark current.

The dark current of a photodiode is the electrical current present within the photodiode in operation, when it is not subjected to a light radiation. It may be formed of currents thermally generated inside the volume of the detection portion (diffusion currents, depletion currents, tunnel currents . . . ) and of surface currents. The surface currents may be related to the presence of electrical charges in the passivation dielectric layer. Indeed, these electrical charges may induce a modification of the curvature of the energy gaps proximate to the surface, leading to the formation of a depleted area or of an inversion area. When located in the footprint area of the photodiode, the depleted area could give rise to generation-recombination type parasitic currents. Moreover, the inversion area, then electrically-conductive, could enable the movement of electrical charges between electrically-polarized regions and located at the interface with the passivation layer.

In the context of the invention, the planar photodiode includes:
  a so-called detection portion of the main semiconductor layer, made of a germanium-based crystalline semiconductor material M0, and including: a first p-type doped region (herein a p+ doped seed layer), a second n-type doped region (herein a n+ doped box), and an intermediate region located between the two doped regions and surrounding the n+ doped box in the main plane of the photodiode;
  a peripheral lateral portion, intended to be electrically polarized, extending along a thickness axis of the photodiode until coming into contact with the first p-type doped region, and extending in contact with the detection portion while surrounding the intermediate region in the main plane, and made of several electrically-conductive materials (doped semiconductor and/or metal) stacked on top of one another along the thickness axis.

As this will be described in detail later on, the peripheral lateral portion includes: at least one first electrically-conductive material M1, having a coefficient of thermal expansion CTE1 lower than the coefficient CTE0 of the germanium-based semiconductor material M0 of the detection portion; and at least one second electrically-conductive material M2, having a coefficient of thermal expansion CTE2 higher than or equal to the coefficient CTE0 of the semiconductor material M0.

The first material M1 and the second material M2 are stacked on top of one another along the thickness axis of the photodiode, so that the first material M1 extends vertically starting from the first face, and the second material M2 extends vertically between the first material M1 and the second face. This arrangement is reflected by the formation, in the intermediate region: of a first portion P1, surrounded by the first material M1 in the main plane, and having mechanical tensile stresses; and of a second portion P2 flush with the second face F2, surrounded by the second material M2 in the main plane, and, formed of a peripheral lateral area Z2p having mechanical compressive stresses. This peripheral lateral area Z2p surrounds a central area Z2c in the main plane, which has mechanical tensile stresses and where the n+ doped box is located.

It should be noted that the mechanical stresses considered herein are oriented in the main plane of the photodiode. The mechanical stresses cause a deformation of the lattices of the crystalline network of the stressed material. When the material is compressed, respectively tensioned, it has a lattice parameter lower, respectively higher, than its natural value when the material is relieved (not stressed).

Also, the presence of tis peripheral lateral area Z2p of the intermediate region where the mechanical stresses are compressive, which is flush with the second face and surrounds the n+ doped box in the main plane, is reflected by a local increase in the band gap energy (gap opening) of the germanium-based material M0, and therefore by a decrease in the surface component of the dark current, which improves the performances of the photodiode.

Figure 1B:
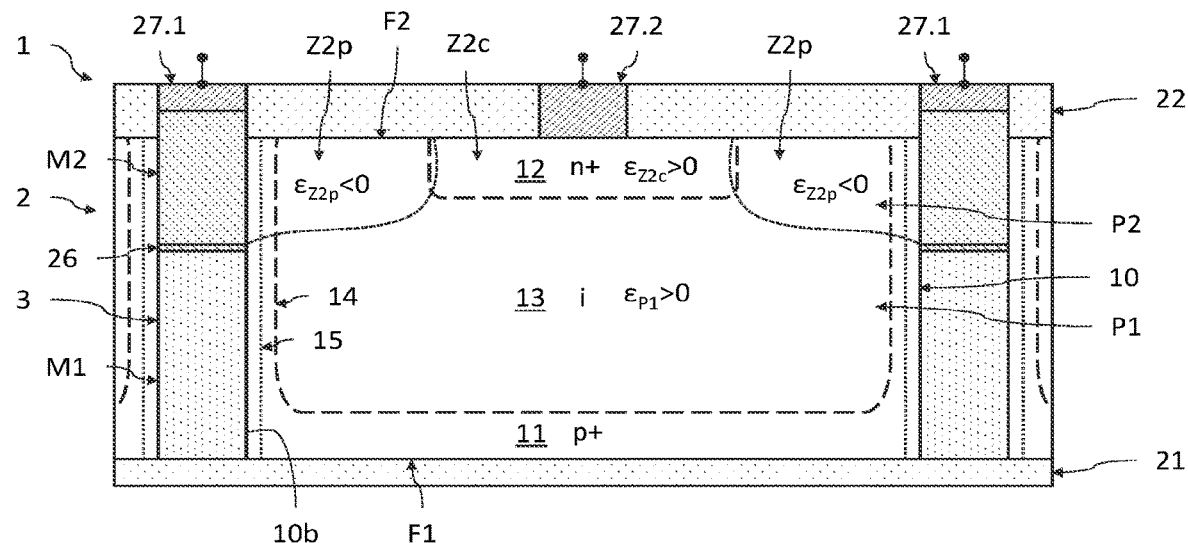
FIG. 1B is a schematic cross-sectional view of a planar photodiode according to one variant.

FIGS. 1A and 1B are schematic and partial cross-sectional views of a planar photodiode 1 according to different embodiments, belonging to an array of photodiodes, preferably identical.

The planar photodiode 1 of FIG. 1B differs from that of FIG. 1A essentially in that the peripheral lateral portion 3 includes an interlayer thin portion 26 located between and in contact with the materials M1 and M2, allowing improving the ohmic contact between these materials. This is the case in particular when the material M1 is p+ doped polysilicon and when the material M2 is titanium nitride. The planar photodiode 1 of FIG. 1B also differs from that of FIG. 1A by the presence of a p doped lateral region 14 and of a lateral area 15 made of SiGe. It should be noted that either one of these features may also be present in the planar photodiode 1 of FIG. 1A.

A three-dimensional direct reference frame XYZ is herein described for the remainder of the description, where the axes X and Y form a plane parallel to the main plane of the photodiodes 1, and where the axis Z is directed along the thickness of the detection portion 10 of the photodiode 1, starting from the front face F1 in the direction of the second face F2. The terms "lower" and "upper" refer to a positioning increasing along the direction +Z defined in FIG. 1A.

Each photodiode 1 is made based on germanium, and is herein reversely polarized starting from the second face F2, while being optically insulated from each other by peripheral lateral portions 3. Each photodiode 1 includes a detection portion 10 made based on germanium, and is adapted to detect the light radiation in the near-infrared (SWIR) range.

The photodiode 1 includes a so-called detection portion 10 of a main semiconductor layer 2, which extends along the axis Z between a first face F1 and a second face F2. The faces F1 and F2 are parallel to each other and opposite to each other. The first face F1 and the second face F2 are common to the photodiodes 1 of the array. In this example, the faces F1 and F2 are substantially planar.

The thickness of the detection portion 10, defined along the axis Z between the first and second faces F1, F2 is herein substantially constant from one photodiode to another, for example is comprised between a few hundred nanometers and a few microns, for example between about 1 µm and 5 µm. The thickness is selected so as to obtain a good absorption in the wavelength range of the light radiation to be detected. The detection portion 10 has a transverse dimension in the plane XY which could be comprised between a few hundred nanometers and a few tens microns, for example comprised between about 1 µm and 20 µm.

The detection portion 10 is made of a germanium-based crystalline semiconductor material, denoted M0, preferably monocrystalline. By germanium-based, it should be understood that the material M0 is germanium or is a compound (binary or tertiary . . . ) formed at least of germanium. Thus, the detection portion 10 may be made, for example, of germanium Ge, of germanium silicon SiGe, of germanium tin GeSn, and possibly of silicon germanium tin SiGeSn. Thus, it may be made of the same semiconductor material and have regions with different conductivity types (homojunction) so as to form a pn or pin junction. Alternatively, it may consist of a stack of underlayers of different semiconductor materials (heterojunction), which are then formed based on germanium.

Thus, the detection portion 10 is formed of a first p-type doped region 11, which is flush with the first face F1 and forms a p-type doped "seed layer", and of a second n-type doped region 12, which is flush with the second face F2 and forms a n-type doped "box". By being flush with, it should be understood "arriving at the level of", or "extending starting from". An unintentionally doped (in the case of a pin junction) or p doped (in the case of a pn junction) intermediate region 13 is located between and in contact with the second doped regions 11, 12, and surrounds the n+ doped box 12 in the main plane. In this example, the semiconductor junction is of the pin type, the seed layer 11 being p+type doped, the box 12 being n+type doped and the intermediate region 13 being unintentionally doped.

The p+ doped seed layer 11 extends in the plane XY starting from the lateral boundary 10b, by being flush with the first face F1. As illustrated in FIG. 1A, it may have a substantially homogeneous thickness along the axis Z and thus be flush only with a lower area of the lateral boundary 10b. Alternatively, as illustrated in FIG. 1B, the p+ doped seed layer may also have a p+ doped lateral region 14 which is continuously flush with the lateral boundary 10b along the axis Z and which extends over the entire periphery of the detection portion 10. The p+ doped seed layer 11 may have a doping that could be comprised between about $10^{18}$ and $10^{20}$ at/cm³.

The n+ doped box 12 herein extends from the second face F2 and is surrounded by the intermediate region 13 in the main plane. It is remote from the lateral boundary 10b of the detection portion 10 in the plane XY to the extent that it is laterally surrounded by the intermediate region 13. It may feature doping that could be comprised between about $10^{19}$ and $10^{21}$ at/cm³.

The intermediate region 13 is vertically located between the p+ doped seed layer and the n+ doped box. It laterally surrounds the n+ doped box in the main plane. It is herein made of a semiconductor material which is unintentionally doped, so as to form a pin junction but may be doped according to the second conductivity type, herein of the p type, to form a pn junction.

Preferably, the photodiode 1 includes a lower insulating layer 21, made of a dielectric material, covering the first face F1 of the detection portion 10, as well as, in this example, the lower face of the peripheral lateral portion 3. The lower insulating layer 21 may also be adapted to form an antireflection function with respect to the incident light radiation. Indeed, it forms the face for receiving the light radiation intended to be detected.

The detection portion 1 is laterally delimited, in the main plane, by a trench, preferably continuous, filled with several electrically-conductive materials stacked along the vertical axis Z, forming a peripheral lateral portion 3. The peripheral lateral portion 3 participates in electrically polarizing the photodiode 1, herein starting from the second face F2, and in pixelating the array of photodiodes (optical insulation). It extends herein over the entire thickness of the detection portion to open onto the lower insulating layer 21 but, alternatively, it is possible that it does not open onto the lower insulating layer 21 and could terminate in the p+ doped seed layer 11. The inner face of this peripheral lateral portion 3 is in contact with the lateral boundary 10b of the detection portion 10. As detailed later on, the peripheral lateral portion 3 is formed by at least one first electrically-conductive material M1 having a coefficient of thermal expansion CTE1 lower than the coefficient CTE0 of the germanium-based material M0 of the detection portion 10, and of at least one second electrically-conductive material M2 having a coefficient of thermal expansion CTE2 higher than or equal to the coefficient CTE0 of the material M0.

Moreover, as illustrated in FIG. 1B, and in the case where the material M1 is silicon-based, the detection portion 10 advantageously includes a p-type doped lateral region 14 located at the lateral boundary 10b. This lateral region 14 has a doping level higher than that of the intermediate region 13 when it is doped. The p+ doped lateral region 14 is flush with the lateral boundary 10b and is herein in contact with the peripheral lateral portion 3. In this example, the lateral region 14 extends over the entire height of the peripheral lateral portion 3, even at the second material M2. This originates from the fact that the material M1 has been deposited over the entire height of the trench 23 (cf. FIG. 2D). Thus, the polarization of the p+ doped seed layer 11 is improved to the extent where the surface of contact with the peripheral lateral portion 3 is increased. In addition, this p+ doped lateral region 14 allows avoiding the footprint area of the photodiode 1 extending up to the lateral boundary 10b. Thus, the contribution of this area (potentially free of defects related to making of the trenches) to the dark current. Thus, the performances of the photodiode 1 are improved.

Moreover, as also illustrated in FIG. 1B, in the case like herein where the detection portion is made of germanium, and where the material M1 of the peripheral lateral portion 3 is silicon-based, the detection portion 10 advantageously includes a lateral area 15 made based on silicon germanium. The lateral area 15 is flush with the lateral boundary 10b and is in contact with the peripheral lateral portion 3. In this example, the lateral area 15 extends over the entire height of the peripheral lateral portion 3, even at the second material M2. This originates from the fact that the material M1 has been deposited over the entire height of the trench 23 (cf. FIG. 2D). Thus, the lateral area 15 has a band gap energy (gap) higher than that of the detection portion 10 made of germanium. This lateral "gap opening" allows reducing the sensitiveness of the photodiode 1 to defects present proximate to the trenches 24. Thus, the performances of the photodiode 1 are also improved.

An upper insulating layer 22 covers the second face F2 of the photodiode 1, and allows passivating the material M0 at the face F2, and electrically insulating the metallic contacts 32.1 and 32.2. Thus, it is in contact with the n+ doped box 12 as well as with the intermediate region 13. Preferably, it is made of a dielectric material, such as a silicon oxide, a silicon nitride, or a silicon oxynitride. It then consists of a passivation dielectric layer. Other dielectric materials may be used, such as a hafnium or aluminum oxide, and possibly an aluminum nitride, inter alia. For example, it has a thickness comprised between 50 nm and 500 nm.

The photodiode 1 further includes metallic contacts 27.1, 27.2 allowing reversely polarizing it starting from the side of the face F2. Thus, a metallic contact 27.2 is herein arranged over and in contact with the n+ doped box 12, and allows ensuring electrical polarization thereof. A metallic contact 27.1 is herein arranged over and in contact with the peripheral lateral portion 3, and allows electrically polarizing the p+ doped seed layer 11. The metallic contacts 27.1, 27.2 are herein electrically insulated from each other in the plane XY by the upper insulating layer 22. The photodiode 1 is intended to be reversely polarized, for example by applying a negative electrical potential at the peripheral lateral portion 3 and by grounding the n+ doped box 12.

In general, for illustration, the photodiode 1 may have dimensions in the plane XY comprised between about 1 μm and 100 μm. The thickness of the p+ doped seed layer 11 may be comprised between about 20 nm and 500 nm. The thickness of the intermediate region 13 may be comprised between 0.7 μm and 2.5 μm when the photodiode 1 is intended to detect a light radiation in the SWIR or near-infrared (NIR) range. The n+ doped box 12 may have a depth comprised between about 10 nm and 600 nm, for example equal to about 300 nm. The upper insulating layer 22 may have a thickness allowing entirely covering the face F2 of the photodiode 1, for example comprised between about 10 nm and 600 nm, and the thickness of the lower insulating layer 21 may be comprised between 50 nm and 1 μm.

To reduce the surface component of the dark current, the peripheral lateral portion 3 is formed by several electrically-conductive materials (doped semiconductors, metals . . . ), stacked vertically along the axis Z and arranged in electrical contact with each other, and in contact with the detection portion. They have properly selected coefficients of thermal expansion.

The objective herein is to generate different mechanical stresses within the intermediate region 13: on the one hand mechanical tensile stresses in the light radiation absorption area, i.e. between the p+ doped seed layer 11 and the n+ doped box 12, so as to increase the absorption cutoff wavelength and thus obtain a photodiode capable of operating in the SWIR range; and on the other hand mechanical compressive stresses in an area flush with the second face F2 and surrounding the n+ doped box 12 in the main plane, so as to locally open the gap and thus reduce the surface component of the dark current.

The first material M1 and the second material M2 are electrically conductive, to the extent that they participate in ensuring the electrical polarization of the p+ doped seed layer 11 starting from the metallic contact 27.2 located at the second face F2. Also, the first material M1 and the second material M2 may be selected from among p-type doped semiconductors and metals. For example, the first material M1 may be a material based on p-type doped silicon, for example p+ doped polysilicon. The second material M2 may be a metallic material or a semiconductor material based on p-type doped germanium, for example p+ doped germanium or a titanium nitride, still possibly a Ti/TiN, Ni/TiN, Ti/Cu or Ti/TiN/Cu combination.

The first material M1 and the second material M2 are stacked on top of one another along the axis Z. They may be in contact with each other (cf. FIG. 1A). This is the case in particular when the second material M2 is p+ doped germanium which rests over the p+ doped polysilicon material M1. Alternatively, they may be separated vertically from each other by an interlayer thin portion 26 allowing improving the ohmic contact (cf. FIG. 1B). This is the case in particular when the second material M2 is titanium nitride which rests over the p+ doped polysilicon material M1. They are also in contact with the lateral boundary 10b of the detection portion 10, so as to be able to generate the desired mechanical stresses within the detection portion 10.

The first material M1 extends from the first face F1 over a distance along the direction +Z preferably at least equal to 50% of the thickness of the detection portion 10, and preferably over a distance comprised between 50% and 80% of this thickness. The second material M2 extends from the first material M1 up to the second face F2, over a distance along the direction +Z preferably at most equal to 50% of the thickness of the detection portion 10, and preferably over a distance comprised between 20 and 50% of this thickness, depending on the height of the first material M1.

The first material M1 has a coefficient of thermal expansion CTE1 lower than the coefficient CTE0 of the germanium-based semiconductor material M0 of the detection portion 10. The second material M2 has a coefficient of thermal expansion CTE2 higher than or equal to the coefficient CTE0 of the semiconductor material M0.

For example, in the case where the detection portion 10 is made of germanium, the first material M1 may be made of p+ doped polysilicon, and the second material M2 may be made of titanium nitride or of p+ doped germanium. The coefficient CTE0 of germanium is equal to 5.9 μm (m×K), that of silicon is equal to 2.6 μn (m×K), and that of titanium nitride is equal to 9.0 μm/(m×K).

The fact that the peripheral lateral portion is made of this first material M1 and of this second material M2 generates different mechanical stresses within the intermediate region 13.

More specifically, the intermediate region 13 has a first portion P1, which is surrounded in the plane XY by the first material M1. Because of the thermal expansion differential between the first material M1 and that of the intermediate region 13, the first portion P1 has mechanical tensile stresses, while the first material M1 has mechanical compressive stresses.

The mechanical tensile stresses locally undergone in the portion P1 of the intermediate region 13 are then reflected in a local modification of the optical and/or electrical properties of the photodiode 1, including in particular a widening of the absorption spectral range of a light radiation: the absorption cutoff wavelength may then be longer than 1,550 nm, so that the photodiode 1 could then function in a wider spectral range, and possibly over the entirety of the SWIR spectral range. In addition, tensioning may also be sufficient to make the energy gap structure of germanium substantially direct in the portion P1 of the intermediate region 13, while the relieved gap structure of germanium is indirect.

In addition, the intermediate region 13 has a second portion P2, which is surrounded in the plane XY by the second material M2. Hence, this second portion P2 is flush with the second face F2 is located over along the axis Z of the first portion P1. Because of the thermal expansion differential between the second material M2 and that of the intermediate region on the one hand, and because of the thermal expansion differential between the second material M2 and the first material M1 on the other hand, the second portion P2 is formed of a peripheral lateral area Z2p, which is flush with the second face F2 and is in contact with the second material M2, and which has mechanical compressive stresses. It arises that this peripheral lateral area Z2p surrounds a central area Z2c (of the detection portion 10, not of the intermediate region 13), which is also flush with the second face F2 and has mechanical tensile stresses. It should also be noted that the second material M2 has mechanical tensile stresses.

The n+ doped box 12 is mainly located in the central area Z2c, i.e. it may be entirely located in the central area Z2c or may have a lateral boundary which is located in the peripheral lateral area Z2p. Moreover, the mechanical stresses remain continuously tensile from the central area Z2c towards the portion P1 of the intermediate region 13, which allows maintaining good performances of the photodiode 1.

The peripheral lateral area Z2p is also flush with the second face F2, and comes laterally in contact with the second material M2. It surrounds the central area Z2c in the main plane, and therefore also the n+ doped box 12. It is located above the first portion P1. To the extent that the intermediate region 13 has locally, i.e. in the peripheral lateral area Z2p, mechanical compressive stresses, the intermediate region 13 has therein a gap opening that reduces the surface component of the dark current.

Also, by this configuration of the peripheral lateral portion 3 which induces areas with different mechanical stresses within the intermediate region 13, and in particular the tensioned portion P1 and the compressed area Z2p, the photodiode 1 is then capable of detecting a light radiation up to a cutoff wavelength longer than 1,550 nm, and also has good performances thanks to the reduction in the surface component of the dark current at the face F2.

FIGS. 2A to 2L schematically and partially illustrate different steps of a method for manufacturing an array of planar photodiodes 1 identical or similar to that illustrated in FIG. 1B.

The photodiodes 1 are made of germanium and include a pin junction. They are adapted to detect an infrared radiation in the SWIR range. The photodiodes 1 are planar and passivated, and are reversely polarized starting from the second face F2 by a hybridized control chip 30 to the photodiode array.

During a first step (FIG. 2A), a first monocrystalline germanium semiconductor underlayer 2.1 is made. The first semiconductor underlayer 2.1 is secured to a support layer 20, preferably a thick substrate (wafer) made of a material having a coefficient of thermal expansion CTEw lower than that of the material M0 of what will become the detection portion 10. In this example, the support layer 20 is a substrate made of silicon. The first semiconductor underlayer 2.1 is assembled to the support layer 20 via the lower insulating layer 21, herein made of silicon oxide. This stack is in the form of a GeOI substrate (standing for Germanium On Insulator). Preferably, this stack is made by means of the process described in the publication by Reboud et al. entitled *Structural and optical properties of 200 mm germanium-on-insulator (GeOI) substrates for silicon photonics applications*, Proc. SPIE 9367, Silicon Photonics X, 936714 (Feb. 27, 2015).

The method of Reboud et al. 2015 has the advantage of making a germanium semiconductor underlayer 2.1 completely free with a low level of structural defects such as dislocations. Germanium may be unintentionally doped or be doped, for example p-type doped. The semiconductor underlayer 2.1 may have a thickness comprised between about 100 nm and 500 nm, for example equal to about 300 nm, and may be covered with a protective layer (not shown) made of a silicon oxide. The lower insulating layer 21 (BOX, standing for Buried Oxide) may have a thickness between 50 nm and 1 µm, for example comprised between 100 nm and 500 nm, and advantageously ensures an antireflection function.

Afterwards, a p-type doping of the first germanium underlayer 2.1 is carried out by ion implantation of a dopant such as boron or gallium, in the case where the first underlayer 2.1 was initially made of intrinsic germanium. Where appropriate, the protective layer has been removed beforehand by surface cleaning, and the first germanium underlayer 2.1 may be coated with a pre-implantation oxide layer (not shown) with a thickness of a few tens of nanometers, for example equal to 20 nm. The germanium underlayer 2.1 then has a doping level comprised between about $10^{18}$ and $10^{20}$ at/cm$^3$. Afterwards, a diffusion annealing of the dopant may be performed under nitrogen, for a few minutes to a few hours, for example 1h, at a temperature that could be comprised between 600° C. and 800° C., for example equal to 800° C. This annealing may not be performed in the case where the underlayer 2.1 was doped on growth. Another way for manufacturing this p+ layer is by epitaxy of a layer of germanium doped with boron in situ between about $10^{18}$ and $10^{20}$ at/cm$^3$ over an intrinsic germanium underlayer. This epitaxy may be done between 400 and 800° C. but preferably at 400° C.

Afterwards, a second germanium semiconductor underlayer 2.2 is made by epitaxy starting from the first underlayer 2.1. The two underlayers 2.1, 2.2 are intended to form the main semiconductor layer 2 as well as the detection portions 10. The second underlayer 2.2 is formed by epitaxy, for example by chemical vapor deposition (CVD) and preferably under reduced pressure (RPCVD) or by any other epitaxy technique. Annealing operations may be performed to reduce the level of dislocations in the underlayer 2.2. Where appropriate, the pre-implementation oxide layer has been removed beforehand by surface cleaning. The second germanium underlayer 2.2 is herein intrinsic, i.e. unintentionally doped to the extent that it is desired to make a pin junction. It is intended to form the light absorption area of the photodiodes 1. Its thickness depends on the wavelength range of the light radiation to be detected in the case of a photodiode 1. In the context of SWIR photodiodes, the intrinsic germanium underlayer 2.2 has a thickness comprised, for example, between 0.5 µm and 3 µm, preferably equal to 1.5 µm.

Afterwards, an upper insulating layer 22 is deposited so as to continuously cover the upper face of the second underlayer 2.2, i.e. so as to cover what will be the detection portions 10 of the photodiodes 1. The upper insulating layer 3 is made of a dielectric material, for example a silicon oxide, nitride or oxynitride. Cleaning of the upper face of the second underlayer 2.2 could have been performed beforehand. The upper insulating layer 22 may have a thickness comprised between 10 nm and 600 nm.

Figure 2A:
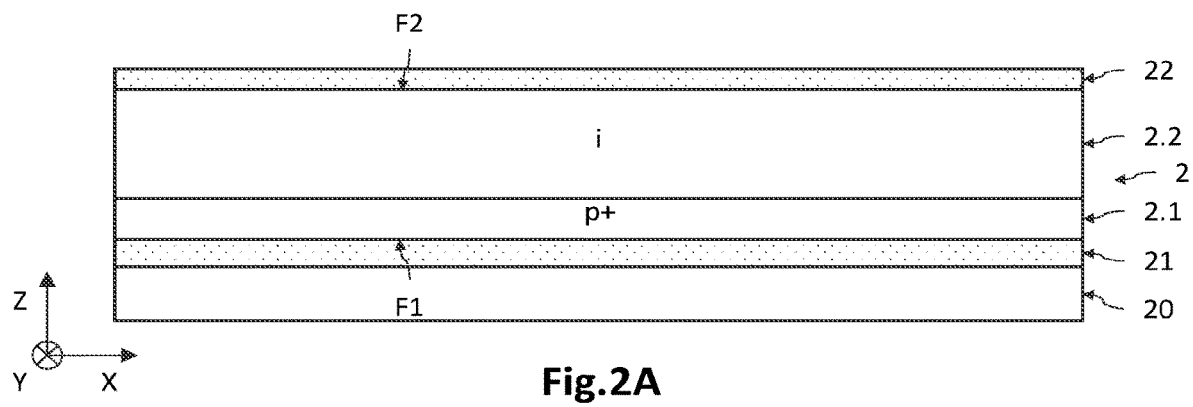
FIGS. 2A to 2L schematically and partially illustrate different steps of a method for manufacturing an array of planar photodiodes identical or similar to that illustrated in FIG. 1B.
Figure 2B:
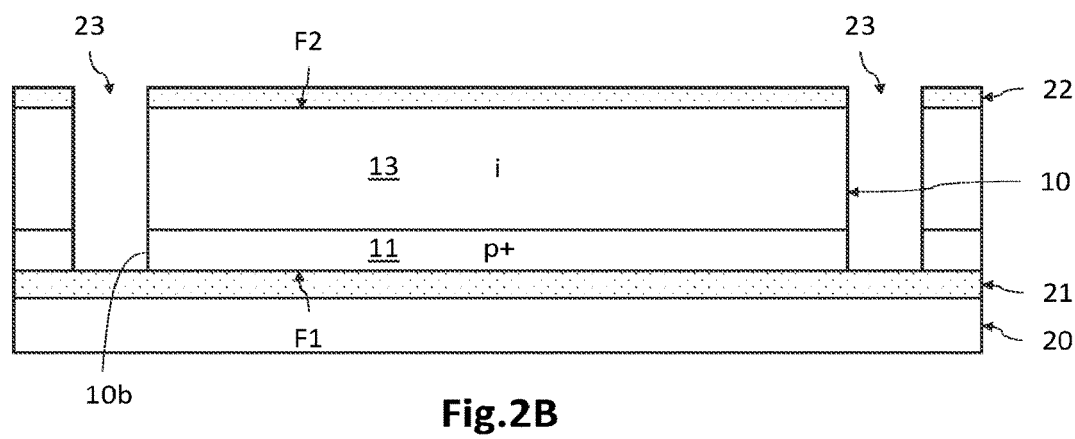

Referring to FIG. 2B, the trenches 23 intended to pixelate the photodiodes 1 and to participate in reversely electrically polarizing them by the peripheral lateral portions 3, are made by photolithography and etching. Thus, a localized etching of the upper insulating layer 22, of the intrinsic germanium underlayer 2.2, and of the p+ doped germanium underlayer 2.1 is carried out until opening herein onto the upper face of the lower insulating layer 21 (but the tranches 23 may open onto the underlayer 2.1 without crossing it). Thus, each trench 23 preferably extends continuously around a photodiode 1. Thus, a plurality of detection portions 10 separated from each other by a continuous trench 23 are obtained. Preferably, they are obtained by an anisotropic etching technique, so as to obtain a substantially vertical lateral boundary 10b along the axis Z. The trenches 23 have a transverse dimension (width) in the plane XY which could be comprised between 300 nm and 2 µm, for example equal to 1 µm. Thus, the detection portions 10 may have a shape in the plane XY that is, for example, circular, oval, polygonal, for example, square, or any other shape.

Figure 2C:
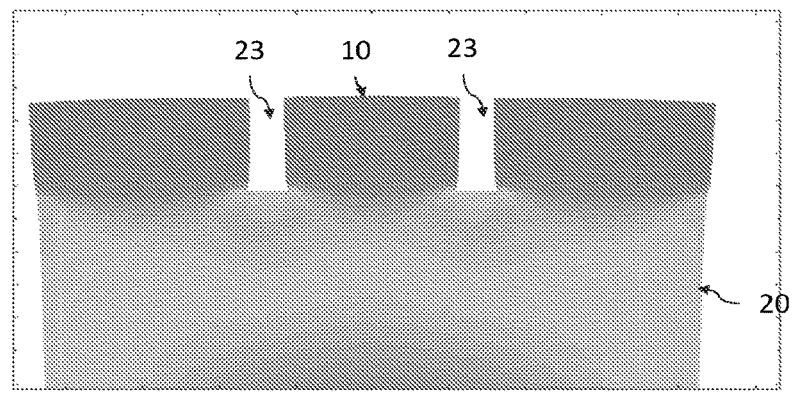
Figure 2D:
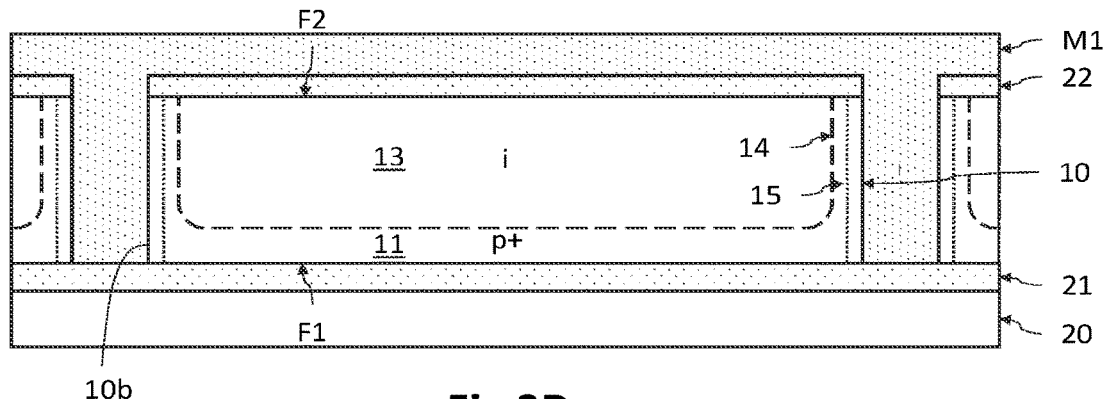
Figure 2E:
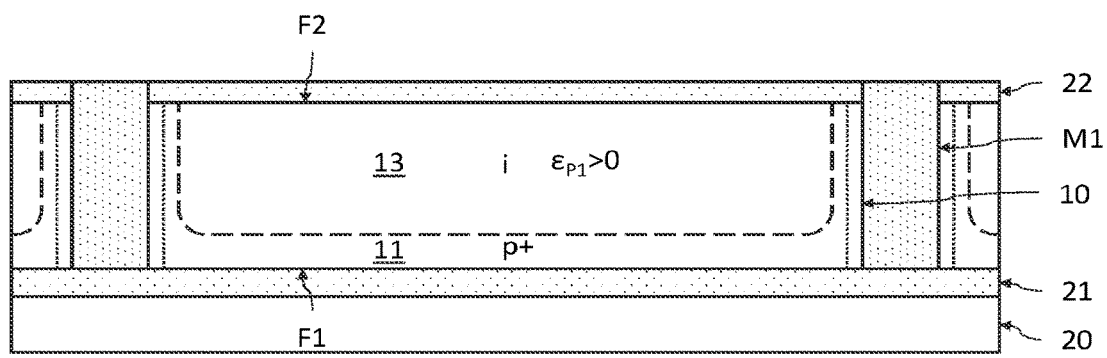

Referring to FIG. 2C to 2E, making of the peripheral lateral portions 3 is started with the deposition of the first material M1 at high temperature.

For this purpose, as illustrated in FIG. 2C, the structure is brought to a deposition temperature T1 higher than room temperature, for example to a few hundred degrees Celsius, like for example at least equal to about 500° C., for example at 650° C. in this case of silicon deposition. Because of the presence of the trenches 23, the germanium of the detection portions 10 expands in the plane XY. This expansion of the germanium is herein accompanied with a bending of the main layer 2 because of the thermal expansion differential between the silicon of the substrate 20 and the germanium of the main layer 2.

It should be noted that FIG. 2C illustrates the strain field in the main plane of the structure then brought to 650° C. These results are derived from a digital simulation performed using the COMSOL software. In this example, the trenches 23 are 2.3 µm deep and 1 µm wide, and the detection portion 10 made of germanium has a width of 4 µm. Germanium rests on a 10 µm thick silicon layer 20 (herein to reduce the computation time). But the Si layer preferably has a thickness of 725 µm (Bulk Silicon). It arises that germanium herein has a maximum tensile strain in the range of 0.65%.

As illustrated in FIG. 2D, growth of the first material M1, herein p+ doped silicon, in the trench 23 is performed by epitaxy, and herein starting from the free surface of the lateral boundary 10b of the detection portions 10. To the extent that the first material M1 is herein silicon, the growth by epitaxy is accompanied with a formation of the SiGe based lateral region 14 and of the lateral area 15. The epitaxial silicon grows starting from the free surface of germanium and fills the trenches 23. Hence, it is in contact with the lateral boundary 10b of the detection portions 10. It is deposited so as to protrude from the trenches 23 and thus covers part of the upper insulating layer 22.

Following the epitaxy step, temperature is brought down to a final temperature lower than the epitaxy temperature, for example to room temperature, for example to 25° C., which causes tensioning of the germanium of the detection portions 10, as well as compression of the first material M1.

Preferably, the material M1 is a silicon-based material, for example amorphous silicon, polycrystalline silicon, germanium silicon. The material M1 is doped according to the second conductivity type, herein p type with boron or with gallium, with a dopant concentration in the range of about $10^{19}$ to $10^{20}$ at/cm$^3$.

As illustrated in FIG. 2E, a chemical-mechanical polishing (CMP) step is performed afterwards, with stoppage at the upper face of the upper insulating layer 23, to eliminate the excess material M1 and to planarize the upper face formed by the upper insulating layer 23 and the first material M1. Thus, in this example, a peripheral lateral portion is obtained which is, for the time being, completely filled with the first p+ doped silicon material M1.

Referring to FIG. 2F to 2I, making of the peripheral lateral portions 3 is carried on by deposition of the second material M2 at high temperature.

Figure 2F:
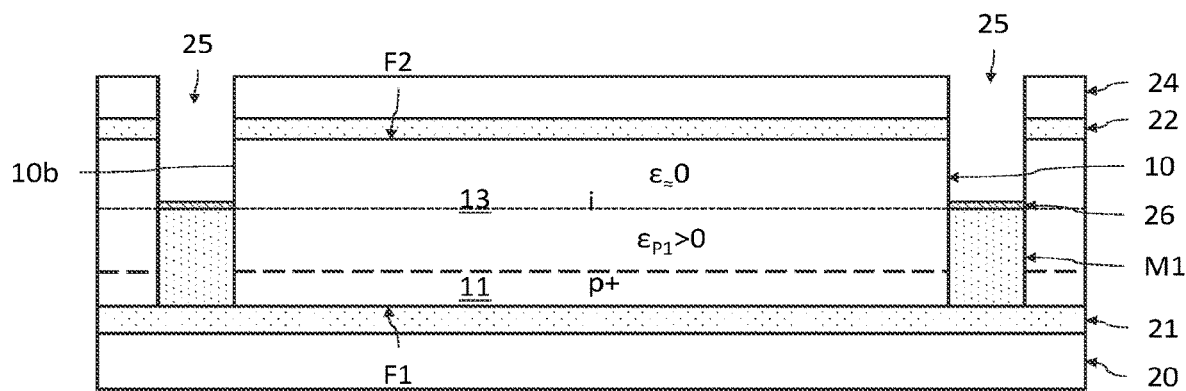

For this purpose, as illustrated in FIG. 2F, a partial etching of the first material M1 is carried out to form an indentation 25. An indentation 25 herein consists of a non-through trench, opening onto a non-etched portion of the material M1. An etching mask 24 made of resin is deposited over the upper insulating layer 22 so as to keep the first material M1 free. Afterwards, the first material M1 is thus etched so as to make a surface of the lateral boundary 10b of the detection portion 10 free. The first material M1 is partially etched along the axis Z, up to a predefined depth so that the first material M1 extends from the first face F1 over a distance at least equal to 50% of the thickness of the detection portion 10.

Following this step of partial etching of the material M1, the intermediate region 13 has a portion P1, surrounded by the material M1, which has mechanical tensile stresses, topped by a portion P2, surrounded by the indentation 25, where germanium is then substantially relieved.

In the case where the second material M2 is TiN, it may be advantageous to form, afterwards, an interlayer thin portion 26 of a few nanometers of Ni or Ti covering the upper surface of the first material M1. The second material M2 is then in electrical contact with the material M1 via the interlayer thin portion 26. The latter allows improving the ohmic contact between the materials M1 and M2. In the case where the material M2 is p+ doped germanium, such an interlayer thin layer 26 may be omitted.

Figure 2G:
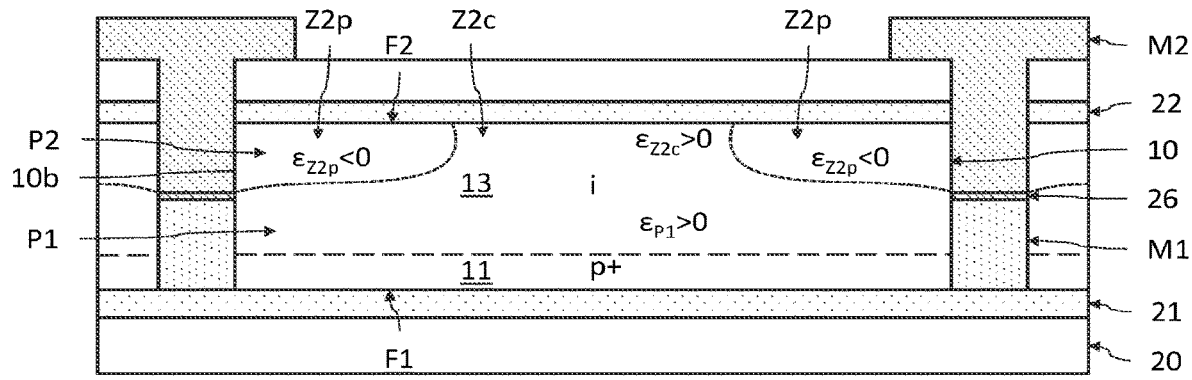

As illustrated in FIG. 2G, growth of the second material M2 in the indentation 25 is performed, afterwards, by epitaxy, tarting from the first material M1 and from the free surface of the lateral boundary 10b of the detection portion 10. The material M2 is deposited so as to completely fill the indentations 25, and it herein covers at least part of the upper insulating layer 22. The deposition temperature T2 is higher than room temperature, for example by a few hundred degrees Celsius, for example at least equal to 300° C. or 400° C. in the case of TiN, or at least equal to 500° C. in the case of p+ doped germanium.

Following the epitaxy step, temperature is brought down to a final temperature lower than the epitaxy temperature, for example to room temperature, for example to 25° C., which causes the formation, in the portion P2 of the intermediate region 13, of the tensioned central area Z2c and of the compressed peripheral lateral area Z2p. The material M2 is then tensioned. It should be noted that in the case where the material M2 is a doped semiconductor, like p+ doped germanium, doping may be performed on growth or after deposition by ion implantation.

Figure 2H:
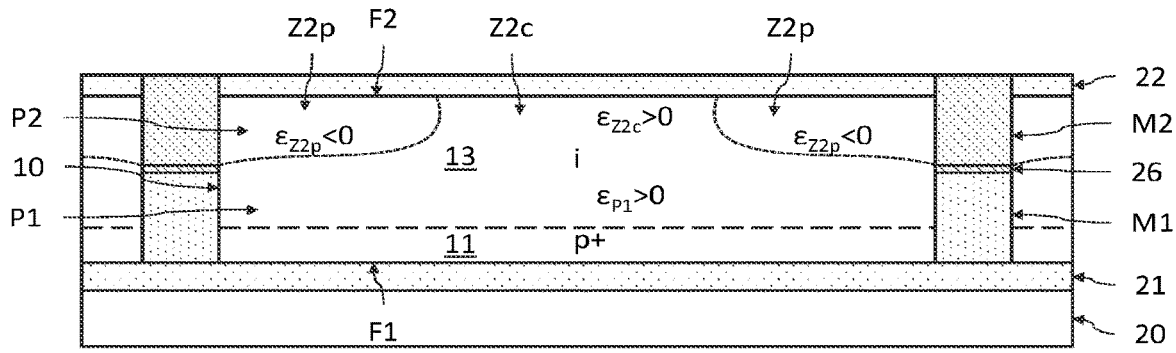

As illustrated in FIG. 2H, a chemical-mechanical polishing (CMP) step is performed afterwards, with stoppage at the upper face of the upper insulating layer 22, to eliminate the excess material M2 and to planarize the upper face formed by the upper insulating layer 22. Thus, in this example, a peripheral lateral portion 3 is obtained which is formed by the p+ doped silicon material M1 topped by the material M2, herein TiN.

Figure 2I:
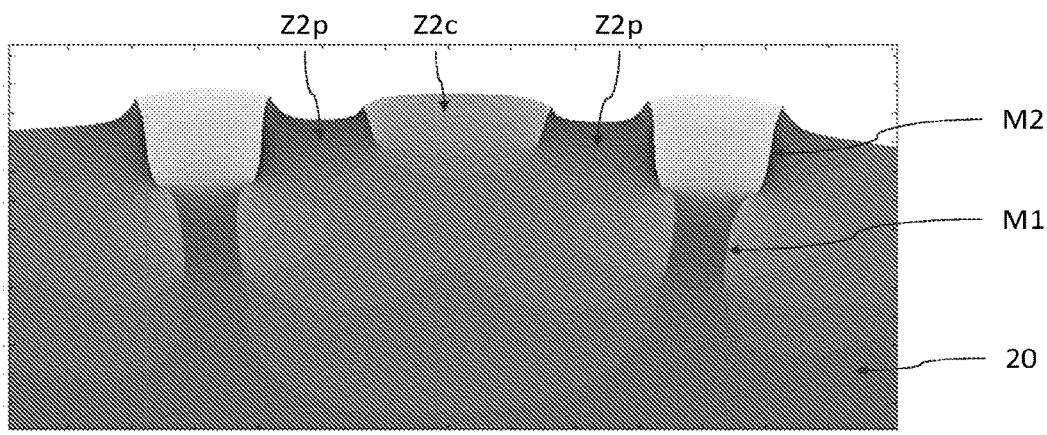
Figure 2J:
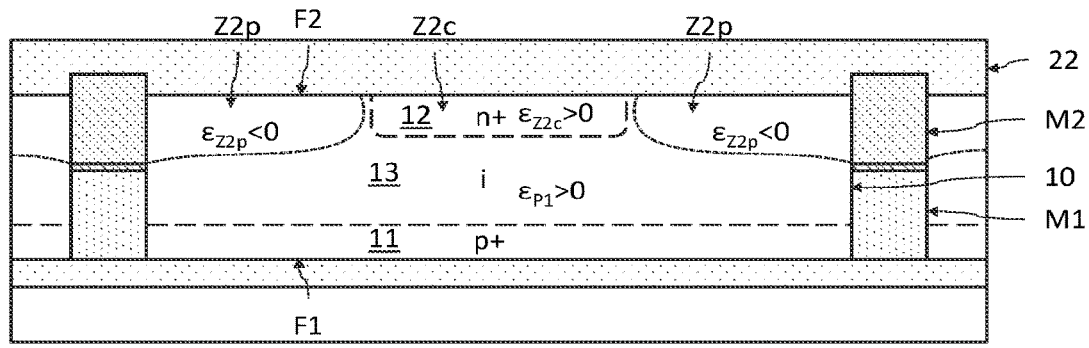
Figure 2K:
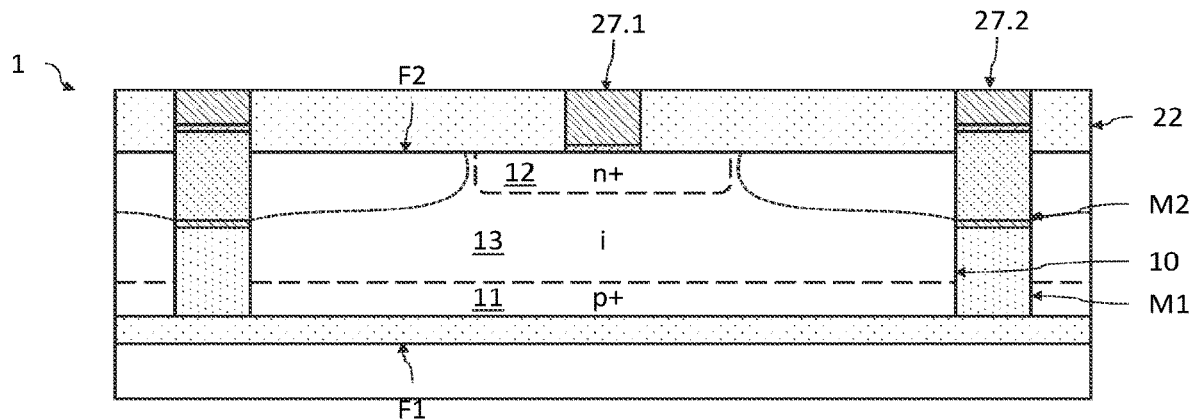
Figure 2L:
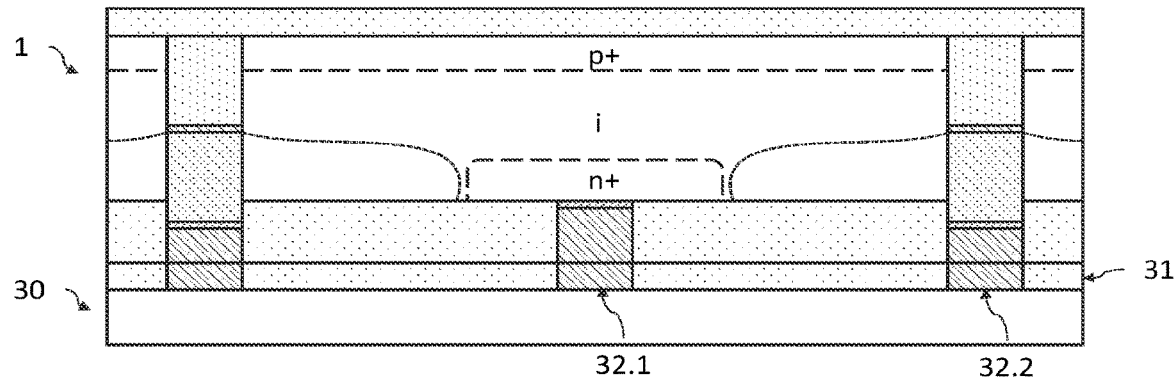

FIG. 2I illustrates the strain field in the main plane of the structure when brought to 650° C., which is similar to that of FIG. 2C. In this example, the p+ doped polysilicon material M1 expands over a height of 1.7 µm and the TiN material M2 expands over a height of 0.8 µm. The germanium is then tensioned in the portion P1 of the intermediate region 13 (and the material M1 is compressed), and tensioned in the central area Z2c while being compressed in the peripheral lateral area Z2p (and the material M2 is tensioned).

During a next step (FIG. 2J), the n+ doped box 12 is made. For this purpose, a protective layer made of a dielectric material, for example made of a silicon oxide, with a thickness comprised for example between about 10 nm and 30 nm is made (this protective layer and the upper insulating layer form together the layer 22). Afterwards, by photolithography, an opening corresponding to an implantation area defining the n+ doped box 12 is defined in a photosensitive resin (not shown). Afterwards, an ion implantation of a dopant such as phosphorous or arsenic is performed throughout the openings. Preferably, the box 12 is n+over-doped, and may thus have a doping level comprised between about $5.10^{18}$ and $3.10^{20}$ at/cm$^3$. The n+ doped box 12 is delimited in the plane XY and along the axis Z by the intermediate region 13. After removal of the photosensitive resin, a diffusion annealing of the dopants may be performed. It should herein be noted that the n+ doped box 12 is mainly located in the central area Z2c. It is herein entirely located in the central area Z2c, but its lateral boundary could be located in the peripheral lateral area Z2p (cf. FIGS. 1A and 1B).

It should be noted that the n+ doped box 12 may also be made, not by ion implantation, but by dopant diffusion from a p doped germanium stud made by localized epitaxy over the face F2. Thus, the crystalline quality of germanium in the detection portion 10 is improved.

Afterwards, during a next step (FIG. 2K), openings are made by localized etching of the upper insulating layer 22, which open onto the n+ doped box 12 and over the peripheral lateral portion 3. Afterwards, contact metallizations 27 are made in the openings, which may be formed by a sheath made of Ti/TiN and by a core made of tungsten W or of copper. For this purpose, a metallic thin layer is deposited in the openings in a conformal manner, for example formed of a titanium Ti underlayer with a thickness of about 5 nm then a titanium nitride TiN underlayer with a thickness of about 10 nm. An annealing is performed so as to improve the electrical contact between the titanium and the germanium of the n+ doped box 12, and between the titanium and the peripheral lateral portion 3 when it is made of germanium. During this annealing, the dopants of the n+ doped box 12 may diffuse so that the latter occupies a larger volume in the detection portion 10. Afterwards, a metallic layer, for example made of tungsten W or of copper Cu, is deposited so as to fill the openings. Afterwards, a chemical-mechanical polishing step is performed, with stoppage at the upper insulating layer 22. Thus, contact metallizations 27.1 and 27.2 formed of a sheath made of Ti/TiN and with a core made of W or of Cu are obtained.

During a next step (FIG. 2L), hybridization of the array of photodiodes 1 thus obtained over a control chip 30 is performed. Thus, the connection face of the control chip 30 may be coated with an insulating layer 31, made of a dielectric material, crossed by contact metallizations 32.1, 32.2. Thus, the array of photodiodes 1 and the control chip 30 are assembled by hybrid molecular adhesion. A bonding annealing may be performed so as to increase the surface bonding energy between the two faces in contact. Afterwards, suppression of the support layer 20 is carried out, for example by grinding, so as to expose a face of the lower insulating layer 21. The latter thus forms the face for receiving the light radiation to be detected.

Thus, the manufacturing method allows obtaining one or more passivated planar photodiode(s) 1, which have improved performances, thanks to the reduction of the surface component of the dark current at the face F2 between the n+ doped box 12 and the peripheral lateral portion 3. The detection portion 10 is tensioned in the portion P1 and locally compressed in the area Z2p, following the steps of depositing at high temperature the materials M and M2 of the peripheral lateral portion 3, by the thermal expansion differentials.

Particular embodiments have just been described. Different variants and modifications should appear to a person skilled in the art.

The invention claimed is:

1. A planar photodiode, including:
    a detection portion of a main semiconductor layer, made of at least one germanium-based crystalline semiconductor material M0, having first and second faces parallel to a main plane, and including: a p-type doped first region, flush with the first face; a n-type doped second region, flush with the second face; and an intermediate region, extending between the first and second doped regions, and surrounding the second doped region in the main plane while being flush with the second face;
    a peripheral lateral portion, intended to be electrically polarized, made of at least one first electrically-conductive material M1, extending, along a vertical axis orthogonal to the main plane, until coming into contact with the first doped region, and extending in contact with the detection portion while surrounding the intermediate region in the main plane;
        the first material M1 having a coefficient of thermal expansion CTE1 lower than that of the material M0, extending from the first face,
            the intermediate region including a first portion P1, surrounded by the first material M1 in the main plane, having mechanical tensile stresses;
    wherein the peripheral lateral portion includes several distinct electrically-conductive materials, stacked on top of one another along the vertical axis, including:
        at least one second material M2, extending between the first material M1 and the second face, having a coefficient of thermal expansion CTE2 higher than or equal to that of the material M0,
            the intermediate region including a second portion P2 flush with the second face F2, surrounded by the second material M2 in the main plane, formed by a peripheral lateral area Z2p having mechanical compressive stresses, which surrounds a central area Z2c in the main plane having mechanical tensile stresses and where the second doped region is located.

2. The planar photodiode according to claim 1, wherein the first material M1 extends, along the thickness axis of the photodiode, starting from the first face F1 over a distance comprised between 50% and 80% of the thickness of the detection portion, and the second material M2 extends, along the thickness axis of the photodiode, starting from the first material M1 up to the second face F2 over a distance comprised between 20% and 50% of the thickness of the detection portion.

3. The planar photodiode according to claim 1, wherein the material M1 is based on p-type doped silicon, and the material M2 is selected from among a metallic material and a p-type doped germanium-based semiconductor material.

4. The planar photodiode according to claim 1, including an interlayer thin portion, made of at least one metallic material, and located between the p-type doped silicon-based material M1 and the metallic material M2.

5. The planar photodiode according to claim 1, wherein the first material M1 is made based on p-type doped silicon and the second material M2 is made of a metallic material, the detection portion including a p-type doped lateral region extending over the entire height of the peripheral lateral portion and in contact with the latter.

6. The planar photodiode according to claim 1, wherein the first material M1 is made based on p-type doped silicon, the detection portion including a lateral area made based on germanium silicon, extending over the entire height of the peripheral lateral portion and in contact with the latter.

7. The planar photodiode according to claim 1, including an upper insulating layer, made of a dielectric material, extending over the second face in contact with the intermediate region and at the peripheral lateral area Z2p.

8. A method for manufacturing at least one planar photodiode according to claim 1, including the following steps:
  making the main semiconductor layer;
  making at least one trench to form the detection portion;
  depositing the first material M1 at a deposition temperature T1 higher than room temperature, so as to fill the trench, then returning to room temperature;
  making at least one indentation by partial etching of the first material M1;
  depositing the second material M2 at a deposition temperature T2 higher than room temperature, so as to fill the indentation, then returning to room temperature, thereby obtaining the central area Z2c and the peripheral lateral area Z2p.

9. The manufacturing method according to claim 8, including a step of making the second doped region located in the central area Z2c.

10. The manufacturing method according to claim 8, wherein the main semiconductor layer is made starting from a support layer having a coefficient of thermal expansion lower than the coefficient CTE0 of the material M0.

* * * * *